(12) United States Patent
Chen et al.

(10) Patent No.: US 11,005,504 B2
(45) Date of Patent: May 11, 2021

(54) POLAR CODE RATE MATCHING METHOD AND APPARATUS

(71) Applicant: HUAWEI TECHNOLOGIES CO., LTD., Guangdong (CN)

(72) Inventors: Ying Chen, Hangzhou (CN); Gongzheng Zhang, Hangzhou (CN); Huazi Zhang, Hangzhou (CN); Yue Zhou, Hangzhou (CN); Yunfei Qiao, Hangzhou (CN); Hejia Luo, Hangzhou (CN); Rong Li, Hangzhou (CN); Jun Wang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/665,294

(22) Filed: Oct. 28, 2019

(65) Prior Publication Data
US 2020/0059253 A1    Feb. 20, 2020

Related U.S. Application Data

(63) Continuation of application No. PCT/CN2018/084461, filed on Apr. 25, 2018.

(30) Foreign Application Priority Data

Apr. 28, 2017    (CN) .......................... 201710296289.X

(51) Int. Cl.
*H03M 13/00*    (2006.01)
*H03M 13/13*    (2006.01)

(52) U.S. Cl.
CPC ....... *H03M 13/6362* (2013.01); *H03M 13/13* (2013.01); *H03M 13/618* (2013.01)

(58) Field of Classification Search
None
See application file for complete search history.

(56) References Cited

U.S. PATENT DOCUMENTS 9,479,291 B2    10/2016  Mahdavifar et al.
10,135,460 B2 *  11/2018  Ionita ...................... H03M 5/18
(Continued)

FOREIGN PATENT DOCUMENTS

| CA | 2968892 A1 | 6/2016 |
| CN | 101674150 B | 6/2013 |

(Continued)

OTHER PUBLICATIONS

PCT International Search Report and Written Opinion in International Application No. PCT/2018/084461, dated Aug. 2, 2018, 15 pages (With English Translation).

(Continued)

*Primary Examiner* — Mujtaba M Chaudry
(74) *Attorney, Agent, or Firm* — Fish & Richardson P.C.

(57) ABSTRACT

The embodiments of the application provides a polar code rate matching method and apparatus. The method includes: obtaining, by a communications device, to-be-encoded information; determining, by the communications device, a to-be-used rate matching manner based on the code rate, a code rate threshold, a target code length, and a target code length threshold, where the rate matching manner is a puncturing manner or a shortening manner; and rate matching, by the communications device based on the determined rate matching manner, a polar code of the to-be-encoded information.

25 Claims, 4 Drawing Sheets

(56) References Cited

U.S. PATENT DOCUMENTS

| | | | |
|---|---|---|---|
| 2011/0191490 A1 | 8/2011 | Du et al. | |
| 2015/0026543 A1* | 1/2015 | Li | H03M 13/45 |
| | | | 714/776 |
| 2015/0293716 A1* | 10/2015 | Jiang | G06F 11/1012 |
| | | | 711/154 |
| 2015/0295593 A1* | 10/2015 | Trifonov | H03M 13/13 |
| | | | 714/776 |
| 2015/0333769 A1 | 11/2015 | Jeong et al. | |
| 2016/0164629 A1* | 6/2016 | Ahn | H04L 63/0428 |
| | | | 714/776 |
| 2016/0285479 A1* | 9/2016 | El-Khamy | H03M 13/616 |
| 2016/0308644 A1 | 10/2016 | Shen et al. | |
| 2016/0352464 A1 | 12/2016 | Shen et al. | |
| 2017/0005753 A1 | 1/2017 | Shen et al. | |
| 2017/0012739 A1 | 1/2017 | Shen et al. | |
| 2017/0126354 A1* | 5/2017 | Marsland | H04L 1/0009 |
| 2017/0149531 A1* | 5/2017 | Raza | H03M 13/37 |
| 2018/0198467 A1* | 7/2018 | Nammi | H04L 1/0002 |
| 2019/0394674 A1 | 12/2019 | Zhang et al. | |

FOREIGN PATENT DOCUMENTS

| | | |
|---|---|---|
| CN | 105164959 A | 12/2015 |
| CN | 105493424 A | 4/2016 |
| CN | 105850059 A | 8/2016 |
| CN | 105874736 A | 8/2016 |
| CN | 106027068 A | 10/2016 |
| CN | 107342845 A | 11/2017 |
| WO | 2016082142 A1 | 6/2016 |
| WO | 2018175557 A1 | 9/2018 |

OTHER PUBLICATIONS

Office Action issued in Chinese Application No. 201910795095.3 dated Apr. 22, 2020, 9 pages (with English Translation).

Zhang et al., "On the Puncturing Patterns for Punctured Polar Codes", 2014 IEEE International Symposium on Information Theory, Jun. 29, 2014, 5 pages.

Extended European Search Report issued in European Application No. 18790245.7 dated Aug. 14, 2020, 11 pages.

Huawei et al., "Polar codes—encoding and decoding," 3GPP TSG RAN WG1 Meeting #xx, R1-164039, Nanjing, China, May 23-27, 2016, 7 pages.

Huawei et al., "Rate matching for Polar code," 3GPP TSG RAN WG1 NR Ad-Hoc #2, R1-1710001, Qingdao, China; Jun. 27-30, 2017, 4 pages.

Mediatek Inc, "Comparison and optimization of Polar code rate matching," 3GPP TSG RAN WG1 RAN1 #88-Bis Meeting, R1-1704460, Spokane, USA, Apr. 3-7, 2017, 10 pages.

Mediatek Inc, "Polar Code Size and Rate-Matching Design for NR Control Channels," 3GPP TSG RAN WG1 RAN1 #88 Meeting, R1-1702735, Athens, Greece, Feb. 13-17, 2017, 8 pages.

Office Action issued in Indian Application No. 201937044713 dated Feb. 15, 2021, 5 pages.

Office Action issued in Japanese Application No. 2019-558699 dated Mar. 2, 2021, 8 pages (with English translation).

Qualcomm Incorporated, "A comprehensive rate-matching scheme for polarcodes and performance evaluation," 3GPP TSG RAN WG1 # 88b, R1-1706675, Spokane, USA, Apr. 3-7, 2017, 10 pages.

\* cited by examiner

POLAR CODE RATE MATCHING METHOD AND APPARATUS

CROSS-REFERENCE TO RELATED APPLICATIONS

This application is a continuation of International Application No. PCT/CN2018/084461, filed on Apr. 25, 2018, which claims priority to Chinese Patent Application No. 201710296289.X, filed on Apr. 28, 2017. The disclosures of the aforementioned applications are hereby incorporated by reference in their entireties.

TECHNICAL FIELD

This application relates to the field of communications technologies, and in particular, to a polar code rate matching method and apparatus.

BACKGROUND

In a communications system, channel encoding is usually performed to improve reliability of data transmission and ensure communication quality. The 5th Generation (5th-generation, 5G) mobile communications technology requires that a wider range of code lengths and code rates can be supported in future channel encoding of relatively low complexity. A polar (polar) code is the first channel encoding method that can "achieve" a channel capacity after strict verification. The polar code is a linear block code. A generator matrix of the polar code is $G_N$, and an encoding process is $x_1^N = u_1^N G_N$, where $u_1^N = (u_1, u_2, \ldots, u_N)$ is a binary row vector of a length N (that is, a code length), $G_N = B_N F_2^{\otimes (\log_2(N))}$, $$F_2 = \begin{bmatrix} 1 & 0 \\ 1 & 1 \end{bmatrix},$$

$B_N$ is an N×N transposed matrix such as a transposed matrix in a bit reversal order, $F_2^{\otimes (\log_2(N))}$ is defined as a Kronecker (Kronecker) product of $\log_2 N$ matrices $F_2$, and $x_1^N$ is an encoded bit (also referred to as a code word). The encoded bit is obtained by multiplying $u_1^N$ by the generator matrix $G_N$, and a process of the multiplication is the encoding process.

It can be learned from the encoding process of the polar code that the code length of the polar code is an integral power of 2. However, in actual communication, a code length needs to be flexibly configured based on a resource size. Therefore, a rate matching technology is required to flexibly change the code length.

According to a reconstruction-based polar code rate matching method among related technologies, reliability of each polarized channel needs to be calculated based on different puncturing patterns, code lengths, code rates, and channel quality by using a relatively complex construction algorithm during encoding, then a location of an information bit or a constant bit is determined, and a mother polar code is punctured from the start or from the end. In this method, performance of the polar code is relatively good. In actual application, a location of an information bit needs to be indicated by using a sequence. During encoding and decoding, locations of information bits may be unified through real-time calculation or table storage. The real-time calculation greatly increases complexity at a transmit end and a receive end. In addition, the table storage causes significantly high complexity in storing a constructed sequence, because different quantities of information bits, different code lengths, and channel conditions need to be considered. Among the related technologies, there is also a technology in which rate matching is implemented through puncturing or shortening (Shorten) based on a constant constructed sequence. When a puncturing manner is used, rate matching may be implemented by using a single constructed sequence and a fixed puncturing manner, and therefore, complexity can be reduced. However, the puncturing manner is applicable only to a low code rate. When a shortening manner is used, a location of a constant bit is adjusted, so that a shortened bit is related only to a known constant bit. In this manner, a constant constructed sequence and a fixed puncturing rule may be used to obtain relatively stable performance at different code rates. However, this solution is applicable only to code rates within a specific range (a medium code rate or a high code rate), and there is a relatively large performance loss under some encoding parameters.

SUMMARY

This application provides a polar code rate matching method and apparatus, to improve overall performance of a polar code.

According to a first aspect, this application provides a polar code rate matching method, including: obtaining, by a communications device, to-be-encoded information or to-be-decoded information; determining, by the communications device, a code rate R, where R=K/M, K is a quantity of information bits, or K is a sum of a quantity of information bits and a quantity of check bits, M is a target code length, and K and M are positive integers; determining, by the communications device, a to-be-used rate matching manner based on the code rate, a code rate threshold, the quantity of information bits, and an information bit threshold, or determining, by the communications device, a to-be-used rate matching manner based on the code rate, a code rate threshold, the target code length, and a target code length threshold, or determining, by the communications device, a to-be-used rate matching manner based on the code rate and two code rate thresholds, where the rate matching manner is a puncturing manner or a shortening manner; and rate matching, by the communications device based on the determined rate matching manner, a polar code of the to-be-encoded information, or rate dematching a polar code of the to-be-decoded information. Therefore, after determining the code rate, the communications device determines the to-be-used rate matching manner by comparing the code rate and the code rate threshold and comparing the quantity of information bits and the information bit threshold, or determines the to-be-used rate matching manner by comparing the code rate and the code rate threshold and comparing the target code length and the target code length threshold, or determines the to-be-used rate matching manner by comparing the code rate and the two preset code rate thresholds. In this way, the puncturing or shortening manner can be flexibly selected, for example, puncturing is used for a low code rate and shortening is used for a high code rate or a medium code rate, so that performance is relatively good under different encoding parameters, and a performance loss is avoided in a puncturing or shortening process.

In a possible design, puncturing is any one of a puncturing manner 1, a puncturing manner 2, a puncturing manner 3, and a puncturing manner 4, the puncturing manner 1 is sequentially puncturing from the start based on a quantity of punctures, the puncturing manner 2 is puncturing in ascending order of reliability of polarized channels based on a quantity of punctures, and the puncturing manner 3 is puncturing based on a quantity of punctures and preset puncturing locations, where in the puncturing manner 3, when the quantity of punctures P≤N/4, where N is a mother code length of the to-be-encoded information, the preset puncturing locations are first P bits, or when P>N/4, the preset puncturing locations are bits 1 to N/4 and a bit j, where j is determined according to the following formulas:

$$j=N/4, \ldots, N/4+\lceil (P-N/4)/2 \rceil -1;$$

$$j=N/2, \ldots, N/2+\lfloor (P-N/4)/2 \rfloor -1;$$

where a symbol $\lceil \ \rceil$ indicates rounding up to the nearest integer, and a symbol $\lfloor \ \rfloor$ indicates rounding down to the nearest integer:

the puncturing manner 4 is: dividing the to-be-encoded information into S1 bit groups of an equal length, where S1 is a positive integer; determining that N1 bit groups need to be punctured; and determining that N2 remaining bits need to be punctured, where N2 is less than a quantity of bits included in one bit group, $$N1 = \left\lfloor \frac{N-M}{N/S1} \right\rfloor,$$

and N2=N−M−N1×(N/S1);

shortening is any one of a shortening manner 1, a shortening manner 2, a shortening manner 3, and a shortening manner 4, the shortening manner 1 is shortening from the end based on a quantity of punctures, the shortening manner 2 is shortening in a bit reversal order from the end based on a quantity of punctures, and the shortening manner 3 is shortening based on a quantity of punctures and preset shortening locations, where in the shortening manner 3, when the quantity of punctures P≤N/4, where N is a mother code length of the to-be-encoded information, the preset shortening locations are first P bits, or when P>N/4, the preset shortening locations are bits (3N/4+1) to N and a bit i, where i is determined according to the following formulas:

$$i=3N/4-\lceil (P-N/4)/2 \rceil +1, \ldots, 3N/4;$$

$$i=N/2-\lfloor (P-N/4)/2 \rfloor +1, \ldots, N/2;$$

the shortening manner 4 is: dividing the to-be-encoded information into S2 bit groups of an equal length, where S2 is a positive integer; determining that L1 bit Groups need to be shortened; and determining that L2 remaining bits need to be punctured, where L2 is less than a quantity of bits included in one bit group, $$L1 = \left\lfloor \frac{N-M}{N/S2} \right\rfloor,$$

and L2=N−M−L1×(N/S2).

In a possible design, the determining, by the communications device, a to-be-used rate matching manner based on the code rate, a code rate threshold, the quantity of information bits, and an information bit threshold includes:

if a first preset condition is met, using any one of the puncturing manner 1, the puncturing manner 2, the puncturing manner 3, and the puncturing manner 4, where the first preset condition is that the code rate is less than or equal to a first code rate threshold $A_1$, the quantity of information bits is less than or equal to a first information bit threshold $B_1$, $A_1$ is any value in a set [1/12, 1/6, 1/5, 1/4, 1/3, 1/2], and $B_1$ is any value in a set [30, 48, 80, 200, 1000];

if a second preset condition is met, using the shortening manner 1, the shortening manner 3, or the shortening manner 4, where the second preset condition is that the code rate is greater than or equal to a second code rate threshold $A_2$, $A_2$ is any value in a set [1/4, 1/3, 1/2, 2/3, 3/4, 5/6], and $A_1$ is less than $A_2$; or if neither the first preset condition nor the second preset condition is met, using the shortening manner 2.

In this possible design, the communications device may compare the code rate and the code rate threshold and compare the quantity of information bits and the information bit threshold. In this way, the puncturing or shortening manner is flexibly selected, for example, puncturing is used for a low code rate and shortening is used for a high code rate or a medium code rate, so that performance is relatively good under different encoding parameters, and a performance loss is avoided in a puncturing or shortening process.

In a possible design, the first preset condition is that the code rate is less than the code rate threshold 1/5 and the quantity of information bits is less than or equal to an information bit threshold 100, or the code rate is less than the code rate threshold 1/4 and the quantity of information bits is less than or equal to the information bit threshold 30, and the second preset condition is that the code rate is greater than the code rate threshold 3/4; or the first preset condition is that the code rate is less than the code rate threshold 1/4 and the quantity of information bits is less than or equal to the information bit threshold 200, and the second preset condition is that the code rate is greater than the code rate threshold 3/4; and the determining, by the communications device, a to-be-used rate matching manner based on the code rate, a code rate threshold, the quantity of information bits, and an information bit threshold includes: if the first preset condition is met, using the puncturing manner 2 or the puncturing manner 4; if the second preset condition is met, using the shortening manner 1 or the shortening manner 3; or if neither the first preset condition nor the second preset condition is met, using the shortening manner 2. In this possible design, performance is relatively good when check bits are not specifically following or followed by information bits.

In a possible design, the determining, by the communications device, a to-be-used rate matching manner based on the code rate, a code rate threshold, the quantity of information bits, and an information bit threshold includes:

if a third preset condition is met, using any one of the puncturing manner 1, the puncturing manner 2, the puncturing manner 3, and the puncturing manner 4, where the third preset condition is that the code rate is less than or equal to a first code rate threshold $A_1$, the quantity of information bits is less than or equal to a first information bit threshold $B_1$, $A_1$ is any value in a set [1/12, 1/6, 1/5, 1/4, 1/3, 1/2], and $B_1$ is any value in a set [30, 48, 80, 200, 1000)]; or if the third preset condition is not met, using the shortening manner 2, the shortening manner 3, or the shortening manner 4. In this possible design, only two rate matching manners are used, and therefore, determining conditions and complexity can be reduced.

In a possible design, the third preset condition is that the code rate is less than or equal to 1/5 and the quantity of information bits is less than or equal to 100, or the third preset condition is that the code rate is less than or equal to 1/4 and the quantity of information bits is less than or equal to 30, or the third preset condition is that the code rate is less than or equal to 1/4 and the quantity of information bits is less than or equal to 200; and the determining, by the communications device, a to-be-used rate matching manner based on the code rate, a code rate threshold, the quantity of information bits, and an information bit threshold includes: if the third preset condition is met, using the puncturing manner 2 or the puncturing manner 4; if the third preset condition is not met, using the shortening manner 2, the shortening manner 3, or the shortening manner 4.

In a possible design, the determining, by the communications device, a to-be-used rate matching manner based on the code rate, a code rate threshold, the target code length, and a target code length threshold includes: if a fourth preset condition is met, using any one of the puncturing manner 1, the puncturing manner 2, the puncturing manner 3, and the puncturing manner 4, where the fourth preset condition is that the code rate is less than or equal to a first code rate threshold $A_1$, and $A_1$ is any value in a set [1/12, 1/6, 1/5, 1/4, 1/3, 1/2]; if a fifth preset condition is met, using the shortening manner 1, the shortening manner 3, or the shortening manner 4, where the fifth preset condition is that the code rate is greater than a second code rate threshold $A_2$ and the target code length is less than or equal to a first code length threshold C, $A_2$ is any value in a set [1/4, 1/3, 1/2, 2/3, 3/4, 5/6], $A_1$ is less than $A_2$, $C=(N/2)\times(1+\beta)$, $\beta=\frac{1}{4}\times(1-(K+Kcrc)/M$, K is a quantity of information bits, and Kcrc is a quantity of check bits; or if neither the fourth preset condition nor the fifth preset condition is met, using the shortening manner 2. In this possible design, the communications device may compare the code rate and the code rate threshold and compare the target code length and the target code length threshold. In this way, the puncturing or shortening manner is flexibly selected, for example, puncturing is used for a low code rate and shortening is used for a high code rate or a medium code rate, so that performance is relatively good under different encoding parameters, and a performance loss is avoided in a puncturing or shortening process. Further, the code length is considered, and therefore, it can be ensured that performance is not apparently poor, but is most stable.

In a possible design, the fourth preset condition is that the code rate is less than or equal to 1/4 or 1/3, and the fifth preset condition is that the code rate is greater than 1/2 and the target code length is less than the first code length threshold C; and the determining, by the communications device, a to-be-used rate matching manner based on the code rate, a code rate threshold, the target code length, and a target code length threshold includes: if the fourth preset condition is met, using the puncturing manner 2 or the puncturing manner 4; if the fifth preset condition is met, using the shortening manner 1, the shortening manner 3, or the shortening manner 4; or if neither the fourth preset condition nor the fifth preset condition is met, using the shortening manner 2.

In a possible design, the determining, by the communications device, a to-be-used rate matching manner based on the code rate and two code rate thresholds includes:

if the code rate is less than or equal to a third code rate threshold $A_3$, using any one of the puncturing manner 1, the puncturing manner 2, the puncturing manner 3, and the puncturing manner 4, where $A_3$ is any value in a set [1/12, 1/6, 1/5, 1/4, 1/3, 2/5];

if the code rate is greater than $A_3$ and less than a fourth code rate threshold $A_4$, using the shortening manner 2, where $A_4$ is any value in a set [1/2, 2, 3, 3/4, 5/6]; or if the code rate is greater than or equal to $A_4$, using the shortening manner 3 or the shortening manner 4.

In this possible design, the communications device may compare the code rate and the two preset code rate thresholds. In this way, the puncturing or shortening manner is flexibly selected, for example, puncturing is used for a low code rate and shortening is used for a high code rate or a medium code rate, so that performance is relatively good under different encoding parameters, and a performance loss is avoided in a puncturing or shortening process.

In a possible design, $A_3$ is 1/4, and $A_4$ is 1/2, and the determining, by the communications device, a to-be-used rate matching manner based on the code rate and two code rate thresholds includes:

if the code rate is less than or equal to 1/4, using the puncturing manner 2 or the puncturing manner 4;

if the code rate is greater than or equal to 1/4 and less than 1/2, using the shortening manner 2; or if the code rate is greater than or equal to 1/2, using the shortening manner 3 or the shortening manner 4.

According to a second aspect, this application provides a polar code rate matching apparatus, including:

an obtaining module, configured to obtain to-be-encoded information or to-be-decoded information; and a processing module, configured to: determine a code rate R, where R=K/M, K is a quantity of information bits, or K is a sum of a quantity of information bits and a quantity of check bits, M is a target code length, and K and M are positive integers; determine a to-be-used rate matching manner based on the code rate, a code rate threshold, the quantity of information bits, and an information bit threshold, or determine a to-be-used rate matching manner based on the code rate, a code rate threshold, the target code length, and a target code length threshold, or determine a to-be-used rate matching manner based on the code rate and two code rate thresholds, where the rate matching manner is a puncturing manner or a shortening manner; and based on the determined rate matching manner, rate match a polar code of the to-be-encoded information, or rate dematch a polar code of the to-be-decoded information.

In a possible design, puncturing is any one of a puncturing manner 1, a puncturing manner 2, a puncturing manner 3, and a puncturing manner 4, the puncturing manner 1 is sequentially puncturing from the start based on a quantity of punctures, the puncturing manner 2 is puncturing in ascending order of reliability of polarized channels based on a quantity of punctures, and the puncturing manner 3 is puncturing based on a quantity of punctures and preset puncturing locations, where in the puncturing manner 3, when the quantity of punctures P≤N/4, where N is a mother code length of the to-be-encoded information, the preset puncturing locations are first P bits, or when P>N/4, the preset puncturing locations are bits 1 to N/4 and a bit j, where j is determined according to the following formulas:

$$j=N/4, \ldots, N/4+\lceil (P-N/4)/2 \rceil -1;$$

$$j=N/2, \ldots, N/2+\lfloor (P-N/4)/2 \rfloor -1;$$

where a symbol $\lceil \ \rceil$ indicates rounding up to the nearest integer, and a symbol $\lfloor \ \rfloor$ indicates rounding down to the nearest integer;

the puncturing manner 4 is: dividing the to-be-encoded information into S1 bit groups of an equal length, where S1 is a positive integer; determining that N1 bit groups need to be punctured; and determining that N2 remaining bits need to be punctured, where N2 is less than a quantity of bits included in one bit group, $$N1 = \left\lfloor \frac{N-M}{N/S1} \right\rfloor,$$

and N2=N−M−N1×(N/S1);

shortening is any one of a shortening manner 1, a shortening manner 2, a shortening manner 3, and a shortening manner 4, the shortening manner 1 is shortening from the end based on a quantity of punctures, the shortening manner 2 is shortening in a bit reversal order from the end based on a quantity of punctures, and the shortening manner 3 is shortening based on a quantity of punctures and preset shortening locations, where in the shortening manner 3, when the quantity of punctures P≤N/4, where N is a mother code length of the to-be-encoded information, the preset shortening locations are first P bits, or when P>N/4, the preset shortening locations are bits (3N/4+1) to N and a bit i, where i is determined according to the following formulas:

$$i=3N/4-\lceil (P-N/4)/2 \rceil +1, \ldots ,3N/4;$$

$$i=N/2-\lfloor (P-N/4)/2 \rfloor +1, \ldots ,N/2;$$

the shortening manner 4 is: dividing the to-be-encoded information into S2 bit groups of an equal length, where S2 is a positive integer; determining that L1 bit groups need to be shortened; and determining that L2 remaining bits need to be punctured, where L2 is less than a quantity of bits included in one bit group. L1=

$$L1 = \left\lfloor \frac{N-M}{N/S2} \right\rfloor,$$

and L2=N−M−L1×(N/S2).

In a possible design, the processing module is configured to:

if a first preset condition is met, use any one of the puncturing manner 1, the puncturing manner 2, the puncturing manner 3, and the puncturing manner 4, where the first preset condition is that the code rate is less than or equal to a first code rate threshold $A_1$, the quantity of information bits is less than or equal to a first information bit threshold $B_1$, $A_1$ is any value in a set [1/12, 1/6, 1/5, 1/4, 1/3, 1/2], and $B_1$ is any value in a set [30, 48, 80, 200, 1000];

if a second preset condition is met, use the shortening manner 1, the shortening manner 3, or the shortening manner 4, where the second preset condition is that the code rate is greater than or equal to a second code rate threshold $A_2$, $A_2$ is any value in a set [1/4, 1/3, 1/2, 2/3, 3/4, 5/6], and $A_1$ is less than $A_2$; or if neither the first preset condition nor the second preset condition is met, use the shortening manner 2.

In a possible design, the first preset condition is that the code rate is less than the code rate threshold 1/5 and the quantity of information bits is less than or equal to an information bit threshold 100, or the code rate is less than the code rate threshold 1/4 and the quantity of information bits is less than or equal to the information bit threshold 30, and the second preset condition is that the code rate is greater than the code rate threshold 3/4; or the first preset condition is that the code rate is less than the code rate threshold 1/4 and the quantity of information bits is less than or equal to the information bit threshold 200, and the second preset condition is that the code rate is greater than the code rate threshold 3/4; and the processing module is specifically configured to:

if the first preset condition is met, use the puncturing manner 2 or the puncturing manner 4;

if the second preset condition is met, use the shortening manner 1 or the shortening manner 3; or if neither the first preset condition nor the second preset condition is met, use the shortening manner 2.

In a possible design, the processing module is configured to:

if a third preset condition is met, use any one of the puncturing manner 1, the puncturing manner 2, the puncturing manner 3, and the puncturing manner 4, where the third preset condition is that the code rate is less than or equal to a first code rate threshold $A_1$, the quantity of information bits is less than or equal to a first information bit threshold $B_1$, $A_1$ is any value in a set [1/12, 1/6, 1/5, 1/4, 1/3, 1/2], and $B_1$ is any value in a set [30, 48, 80, 200, 1000]; or if the third preset condition is not met, use the shortening manner 2, the shortening manner 3, or the shortening manner 4.

In a possible design, the third preset condition is that the code rate is less than or equal to 1/5 and the quantity of information bits is less than or equal to 100, or the third preset condition is that the code rate is less than or equal to 1/4 and the quantity of information bits is less than or equal to 30, or the third preset condition is that the code rate is less than or equal to 1/4 and the quantity of information bits is less than or equal to 200; and the processing module is specifically configured to:

if the third preset condition is met, use the puncturing manner 2 or the puncturing manner 4;

if the third preset condition is not met, use the shortening manner 2, the shortening manner 3, or the shortening manner 4.

In a possible design, the processing module is configured to:

if a fourth preset condition is met, use any one of the puncturing manner 1, the puncturing manner 2, the puncturing manner 3, and the puncturing manner 4, where the fourth preset condition is that the code rate is less than or equal to a first code rate threshold $A_1$ and $A_1$ is any value in a set [1/12, 1/6, 1/5, 1/4, 1/3, 1/2];

if a fifth preset condition is met, use the shortening manner 1, the shortening manner 3, or the shortening manner 4, where the fifth preset condition is that the code rate is greater than a second code rate threshold $A_2$ and the target code length is less than or equal to a first code length threshold C, $A_2$ is any value in a set [1/4, 1/3, 1/2, 2/3, 3/4, 5/6], $A_1$ is less than $A_2$, C=(N/2)×(1+β), β=1/4×(1−(K+Kcrc)/M, K is a quantity of information bits, and Kcrc is a quantity of check bits; or if neither the fourth preset condition nor the fifth preset condition is met, use the shortening manner 2.

In a possible design, the fourth preset condition is that the code rate is less than or equal to 1/4 or 1/3, and the fifth preset condition is that the code rate is greater than 1/2 and the target code length is less than the first code length threshold C; and the processing module is specifically configured to:

if the fourth preset condition is met, use the puncturing manner 2 or the puncturing manner 4; or if the fifth preset condition is met, use the shortening manner 1, the shortening manner 3, or the shortening manner 4; or if neither the fourth preset condition nor the fifth preset condition is met, use the shortening manner 2.

In a possible design, the processing module is configured to:

if the code rate is less than or equal to a third code rate threshold $A_3$, use any one of the puncturing manner 1, the puncturing manner 2, the puncturing manner 3, and the puncturing manner 4, where $A_3$ is any value in a set [1/12, 1/6, 1/5, 1/4, 1/3, 2/5];

if the code rate is greater than $A_3$ and less than a fourth code rate threshold $A_4$, use the shortening manner 2, where $A_4$ is any value in a set [1/2, 2/3, 3/4, 5/6]; or if the code rate is greater than or equal to $A_4$, use the shortening manner 3 or the shortening manner 4.

In a possible design, $A_3$ is 1/4, $A_4$ is 1/2, and the processing module is specifically configured to:

if the code rate is less than or equal to 1/4, use the puncturing manner 2 or the puncturing manner 4;

if the code rate is greater than or equal to 1/4 and less than 1/2, use the shortening manner 2; or if the code rate is greater than or equal to 1/2, use the shortening manner 3 or the shortening manner 4.

For beneficial effects of the second aspect and all possible designs of the second aspect, refer to beneficial effects of the first aspect and all possible designs of the first aspect, because the beneficial effects are the same. Details are not described herein again.

According to a third aspect, this application provides a polar code rate matching apparatus, including a transceiver, a memory, and a processor, where the transceiver is configured to obtain to-be-encoded information or to-be-decoded information;

the memory is configured to store a program instruction; and the processor is configured to invoke the program instruction in the memory, to perform the polar code rate matching method according to the first aspect and any possible design of the first aspect.

A fourth aspect of this application provides a readable storage medium. The readable storage medium stores an execution instruction. When at least one processor of a polar code rate matching apparatus executes the execution instruction, the polar code rate matching apparatus performs the method according to the first aspect and any possible design of the first aspect.

A fifth aspect of this application provides a program product. The program product includes an execution instruction, and the execution instruction is stored in a readable storage medium. At least one processor of a polar code rate matching apparatus may read the execution instruction from the readable storage medium, and the at least one processor executes the execution instruction, so that the polar code rate matching apparatus performs the method according to the first aspect and any possible design of the first aspect.

DESCRIPTION OF EMBODIMENTS

This application relates to a channel encoding technology used in a 5G communications scenario to improve reliability of information transmission and ensure communication quality, and may be applied to a scenario in which information is polar encoded and decoded, for example, may be applied to a scenario in which uplink control information and downlink control information of enhanced mobile broadband (Enhanced Mobile Broad Band, eMBB) is polar encoded and decoded, or may be applied to another scenario, for example, applied to a channel encoding part of channel encoding (Channel encoding), uplink control information, downlink control information, and a sidelink channel in the communications standard clause 5.1.3 of 3GPP TS 36.212. This is not limited in this application. In addition, this application may be applied to other scenarios in which data information is polar encoded and decoded.

Figure 1:
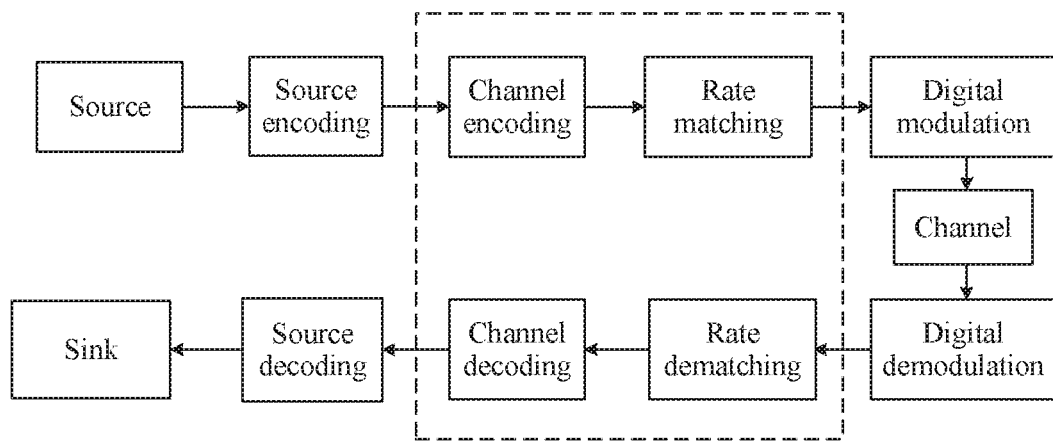
FIG. 1 is a schematic flowchart of a communications system.

FIG. 1 is a schematic flowchart of a communications system. A structure in which channel encoding occurs in the communications system is shown in FIG. 1. During transmission, on a sending device, information is source encoded, channel encoded, and rate matched to obtain a rate matched bit, and the rate matched bit is digitally modulated and sent out from a channel. On a receiving device, digital demodulation is performed on received to-be-decoded information to obtain a log-likelihood ratio (Log Likelihood Ratio, LLR) sequence. Then, the LLR sequence is rate dematched, channel decoded, and source decoded to obtain decoded information. The channel encoding and rate matching are crucial to reliability of information transmission in the entire communications system.

Figure 2:
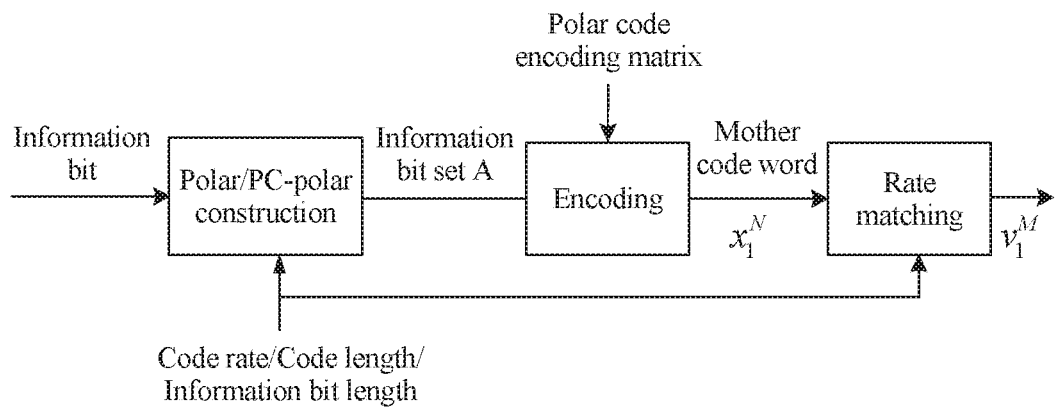
FIG. 2 is a schematic diagram of a polar code encoding process.

FIG. 2 is a schematic diagram of a polar code encoding process. A polar code is encoded by a sending device. As shown in FIG. 2, the polar code encoding process includes three processing processes: construction (Polar/Parity-Check (Parity-Check. PC)-Polar construction), encoding, and rate matching. Before polar code encoding, polarization weight assessment or reliability assessment is first performed on a polarized channel based on an input quantity of information bits and a code length or a code rate, where Code rate=Quantity of information bits/Code length (if reliability assessment is performed, a signal-to-noise ratio also needs to be input). Then an information bit set A is selected based on reliability of the polarized channel, where the information bit set A is a set of sequence numbers (indexes) of information bits; and the polar code is encoded. During polar code encoding, some bits in $u_1^N$ are used to carry information and are referred to as information bits, and a set of indexes of the information bits is denoted as A other bits in $u_1^N$ are set to fixed values pre-agreed on between a transmit end and a receive end and are referred to as constant bits, and a set of indexes of these bits is denoted as a complementary set $A^c$ of A. A constant bit is usually set to 0. A constant bit sequence may be set to any value provided that the value is pre-agreed on between the transmit end and the receive end. Therefore, an output of the polar code encoding may be simplified as $x_1^N = u_A G_N(A)$, where $u_A$ is a set of information bits in $u_1^N$, and $u_A$ is a row vector of a length K, to be specific: |A|=K, where |•| indicates a quantity of elements in a set, and K is a size of an information block;

and $G_N(A)$ is a submatrix including rows that are corresponding to the indexes in the set A and that are in a matrix $G_N$, and $G_N(A)$ is a K×N matrix. After encoding, encoded bits $x_1^N = u_A G_N(A)$ are obtained, where $G_N$ is a polar code encoding matrix, and $G_N(A)$ is a submatrix including rows that are corresponding to the indexes in the set A and that are in the matrix $G_N$. Ultimately, the polar code is encoded and rate matched based on a target code length M, the encoding matrix $G_N$ (uniquely determined based on a mother code length N) of the polar code, and A, to obtain a target code word $V_1^M$. During the polar code encoding, a selected rate matching manner directly affects overall performance of the polar code. The following describes in detail, with reference to accompanying drawings, a polar code rate matching method and apparatus provided in this application.

It should be noted that embodiments of this application are applicable to a rate matching manner in a non-repeating case, and repetition indicates that a rate matching manner with a target code length is obtained by repeating encoded bits. In this application, performance of a polar code mainly means decoding performance, and a packet error rate is relatively low during decoding.

This application is mainly applied to various wireless communications systems and functions on a digital signal processing unit in the systems to improve reliability of wireless communication.

In this application, a communication apparatus mainly includes a network device or a terminal device. If a sending device in this application is a network device, a receiving device is a terminal device; or if a sending device in this application is a terminal device, a receiving device is a network device. The network device is, for example, a base station, and mainly implements communication between the network device and the terminal device.

In the embodiments of this application, the terminal device (terminal device) includes but is not limited to a mobile station (MS. Mobile Station), a mobile terminal (Mobile Terminal), a mobile telephone (Mobile Telephone), a handset (handset), portable equipment (portable equipment), and the like. The terminal device may communicate with one or more core networks over a radio access network (Radio Access Network, RAN). For example, the terminal device may be a mobile telephone (or referred to as a "cellular" telephone) or a computer that has a wireless communication function; or the terminal device may be a portable, pocket-sized, handheld, computer built-in, or in-vehicle mobile apparatus or device.

The embodiments of this application are described with reference to a network device. The network device may be a device configured to communicate with a terminal device. For example, the network device may be a base transceiver station (Base Transceiver Station, BTS) in a GSM system or a CDMA system, may be a NodeB (NodeB, NB) in a WCDMA system, or may be an evolved NodeB (Evolutional NodeB, eNB or eNodeB) in an LTE system. Alternatively, the network device may be a relay node, an access point, an in-vehicle device, a wearable device, a network-side device in a future 5G network, a network device in a future evolved PLMN network, or the like.

Figure 3:
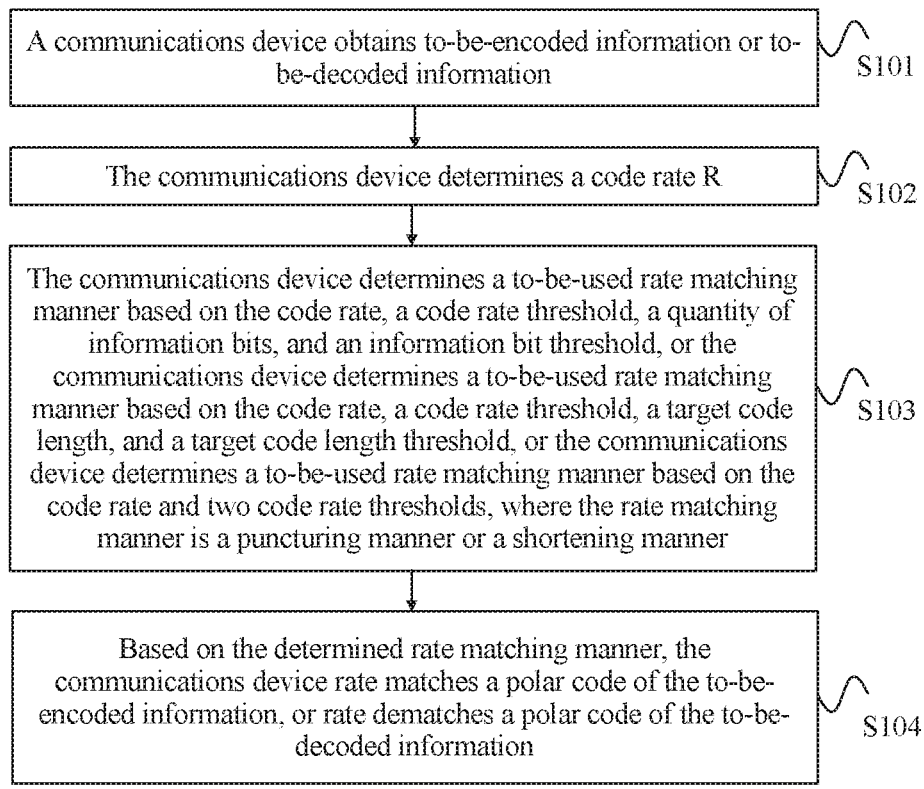
FIG. 3 is a flowchart of a polar code rate matching method embodiment according to this application.

FIG. 3 is a flowchart of a polar code rate matching method embodiment according to this application. As shown in FIG. 3, a method in this embodiment may include the following steps.

S101. A communications device obtains to-be-encoded information or to-be-decoded information.

The communications device may be a sending device or a receiving device. When the communications device is a sending device, the to-be-encoded information is obtained; or when the communications device is a receiving device, the to-be-decoded information is obtained.

S102. The communications device determines a code rate R.

R=K/M, K is a quantity of information bits, or K is a sum of a quantity of information bits and a quantity of check bits, M is a target code length, and K and M are positive integers.

Specifically, after obtaining the to-be-encoded information, the communications device may obtain K and M, so that a transmission code rate can be calculated based on K and M of the to-be-encoded information.

S103. The communications device determines a to-be-used rate matching manner based on the code rate, a code rate threshold, the quantity of information bits, and an information bit threshold, or the communications device determines a to-be-used rate matching manner based on the code rate, a code rate threshold, the target code length, and a target code length threshold, or the communications device determines a to-be-used rate matching manner based on the code rate and two code rate thresholds, where the rate matching manner is a puncturing manner or a shortening manner.

Puncturing may be any one of a puncturing manner 1, a puncturing manner 2, a puncturing manner 3, and a puncturing manner 4. The puncturing manner 1 is sequentially puncturing from the first bit of the to-be-encoded information based on a quantity of punctures. The puncturing manner 2 is puncturing in ascending order of reliability of polarized channels based on a quantity of punctures. The puncturing manner 3 is puncturing based on a quantity of punctures and preset puncturing locations. In the puncturing manner 3, when the quantity of punctures P≤N/4, where N is a mother code length of the to-be-encoded information, the preset puncturing locations are P bits from the first bit of the to-be-encoded information, or when P>N/4, the preset puncturing locations are bits 1 to N/4 and a bit j, where j is determined according to the following formulas:

$$j = N/4, \ldots, N/4 + \lceil (P-N/4)/2 \rceil - 1;$$

$$j = N/2, \ldots, N/2 + \lfloor (P-N/4)/2 \rfloor - 1;$$

where a symbol $\lceil \ \rceil$ indicates rounding up to the nearest integer, and a symbol $\lfloor \ \rfloor$ indicates rounding down to the nearest integer.

The puncturing manner 4 is: dividing the to-be-encoded information into S1 bit groups of an equal length, where S1 is a positive integer; determining that N1 bit groups need to be punctured; and determining that N2 remaining bits need to be punctured, where N2 is less than a quantity of bits included in one bit group.

$$N1 = \left\lfloor \frac{N-M}{N/S1} \right\rfloor,$$

and N2=N−M−N1×(N/S1). In other words, the to-be-encoded information is first divided into bit groups of an equal length and then is punctured by group, and N2 bits are insufficient to form a group.

Shortening may be any one of a shortening manner 1, a shortening manner 2, a shortening manner 3, and a shortening manner 4. The shortening manner 1 is shortening from the last bit of the to-be-encoded information based on a quantity of punctures. The shortening manner 2 is shortening in a bit reversal order from the end based on a quantity of punctures. For the bit reversal order, for example, bits whose bit sequence numbers are (0, 1, 2, 3, 4, 5, 6, 7) are indicated as binary digits (000, 001, 010, 011, 100, 101, 110, 111). After bit reversing is performed on the binary digits, (000, 100, 010, 110, 001, 101, 011, 111) is obtained, and corresponding decimal digits are indicated as (0, 4, 2, 6, 1, 5, 3, 7). If four bits are to be punctured in a bit reversal order from the start, punctured bits are (0, 4, 2, 6).

The shortening manner 3 is shortening based on a quantity of punctures and preset shortening locations. In the shortening manner 3, when the quantity of punctures P≤N/4, where N is a mother code length of the to-be-encoded information, the preset shortening locations are first P bits, or when P>N/4, the preset shortening locations are bits (3N/4+1) to N and a bit i, where i is determined according to the following formulas:

$$i = 3N/4 - \lceil (P-N/4)/2 \rceil + 1, \ldots, 3N/4;$$

$$i = N/2 - \lfloor (P-N/2)/2 \rfloor + 1, \ldots, N/2.$$

The shortening manner 4 is: dividing the to-be-encoded information into S2 bit groups of an equal length, where S2 is a positive integer; determining that L1 bit groups need to be shortened; and determining that L2 remaining bits need to be punctured, where L2 is less than a quantity of bits included in one bit group, $$L1 = \left\lfloor \frac{N-M}{N/S2} \right\rfloor,$$

and L2=N−M−L1×(N/S2). In other words, the to-be-encoded information is first divided into bit groups of an equal length and then is shortened by group, and L2 bits are insufficient to form a group.

S104. Based on the determined rate matching manner, the communications device rate matches a polar code of the to-be-encoded information, or rate dematches a polar code of the to-be-decoded information.

In this embodiment, there are three optional implementations of selecting the rate matching manner by the communications device in S103. Details are as follows.

I. The communications device determines the to-be-used rate matching manner based on the code rate, the code rate threshold, the quantity of information bits, and the information bit threshold. In this manner, there are specifically two optional cases.

1. If a first preset condition is met, any one of the puncturing manner 1, the puncturing manner 2, the puncturing manner 3, and the puncturing manner 4 is used. The first preset condition is that the code rate is less than or equal to a first code rate threshold $A_1$, the quantity of information bits is less than or equal to a first information bit threshold $B_1$, $A_1$ is any value in a set [1/12, 1/6, 1/5, 1/4, 1/3, 1/2], and $B_1$ is any value in a set [30, 48, 80, 200, 1000]. Generally, a higher code rate threshold indicates a lower information bit quantity threshold. For example, an information bit quantity threshold [30, 48, 80] corresponds to a code rate threshold 1/3 or 1/2, and an information bit quantity threshold [200, 1000] corresponds to a code rate threshold 1/3, 1/4, or 1/5. In addition, if a second preset condition is met, the shortening manner 1, the shortening manner 3, or the shortening manner 4 is used. The second preset condition is that the code rate is greater than or equal to a second code rate threshold $A_2$, $A_2$ is any value in a set [1/4, 1/3, 1/2, 2/3, 3/4, 5/6], and $A_1$ is less than $A_2$. If neither the first preset condition nor the second preset condition is met, the shortening manner 2 is used. For example, if the first code rate threshold is 1/12, the second code rate threshold is 1/4, the first information bit threshold is 80, the code rate is less than or equal to 1/12, and the quantity of information bits is less than or equal to 80, any one of the puncturing manner 1, the puncturing manner 2, the puncturing manner 3, and the puncturing manner 4 is used; if the code rate is greater than 1/12 and less than or equal to 1/4, the shortening manner 2 is used; or if the code rate is greater than 1/4, the shortening manner 1, the shortening manner 3, or the shortening manner 4 is used.

In this implementation, the communications device may compare the code rate and the code rate threshold and compare the quantity of information bits and the information bit threshold. In this way, the puncturing or shortening manner is flexibly selected, for example, puncturing is used for a low code rate and shortening is used for a high code rate or a medium code rate, so that performance is relatively good under different encoding parameters, and a performance loss is avoided in a puncturing or shortening process.

In this manner, optionally, the first preset condition is that the code rate is less than the code rate threshold 1/5 and the quantity of information bits is less than or equal to an information bit threshold 100, or the code rate is less than the code rate threshold 1/4 and the quantity of information bits is less than or equal to the information bit threshold 30, and the second preset condition is that the code rate is greater than the code rate threshold 3/4. Correspondingly, if the first preset condition is met, the puncturing manner 2 or the puncturing manner 4 is used; if the second preset condition is met, the shortening manner 1 or the shortening manner 3 is used; or if neither the first preset condition nor the second preset condition is met, the shortening manner 2 is used. In this manner, performance is relatively good when check bits are not specifically following or followed by information bits.

In this manner, optionally, the first preset condition is that the code rate is less than the code rate threshold 1/4 and the quantity of information bits is less than or equal to the information bit threshold 200, and the second preset condition is that the code rate is greater than the code rate threshold 3/4. Correspondingly, if the first preset condition is met, the puncturing manner 2 or the puncturing manner 4 is used; if the second preset condition is met, the shortening manner 1 or the shortening manner 3 is used; or if neither the first preset condition nor the second preset condition is met, the shortening manner 2 is used. In this manner, performance is relatively good when check bits are following all information bits.

2. If a third preset condition is met, any one of the puncturing manner 1, the puncturing manner 2, the puncturing manner 3, and the puncturing manner 4 is used. The third preset condition is that the code rate is less than or equal to a first code rate threshold $A_1$, the quantity of information bits is less than or equal to a first information bit threshold $B_1$, $A_1$ is any value in a set [1/12, 1/6, 1/5, 1/4, 1/3, 1/2], and $B_1$ is any value in a set [30, 48, 80, 200, 1000]. If the third preset condition is not met, the shortening manner 2, the shortening manner 3, or the shortening manner 4 is used.

Different from the manner 1, in this manner, only two rate matching manners are used, and therefore, determining conditions and complexity can be reduced.

In this manner, optionally, the third preset condition is that the code rate is less than or equal to 1/5 and the quantity of information bits is less than or equal to 100, or the third preset condition is that the code rate is less than or equal to 1/4 and the quantity of information bits is less than or equal to 30. If the third preset condition is met, the puncturing manner 2 or the puncturing manner 4 is used, or if the third preset condition is not met, the shortening manner 2, the shortening manner 3, or the shortening manner 4 is used.

Different from the manner 1, in this optional manner, only two rate matching manners are used, and therefore, determining conditions and complexity can be reduced. In addition, performance is relatively good when check bits are not specifically following or followed by information bits.

In this manner, optionally, the third preset condition is that the code rate is less than or equal to 1/4 and the quantity of information bits is less than or equal to 200. Correspondingly, if the third preset condition is met, the puncturing manner 2 or the puncturing manner 4 is used; or if the third preset condition is not met, the shortening manner 2, the shortening manner 3, or the shortening manner 4 is used.

In this optional manner, performance is relatively good when check bits are following all information bits.

II. The communications device determines the to-be-used rate matching manner based on the code rate, the code rate threshold, the target code length, and the target code length threshold. In this manner, there is specifically one optional case.

If a fourth preset condition is met, any one of the puncturing manner 1, the puncturing manner 2, the puncturing manner 3, and the puncturing manner 4 is used. The fourth preset condition is that the code rate is less than or equal to a first code rate threshold $A_1$, and $A_1$ is any value in a set [1/12, 1/6, 1/5, 1/4, 1/3, 1/2]. If a fifth preset condition is met, the shortening manner 1, the shortening manner 3, or the shortening manner 4 is used. The fifth preset condition is that the code rate is greater than a second code rate threshold $A_2$ and the target code length is less than or equal to a first code length threshold C, $A_2$ is any value in a set [1/4, 1/3, 1/2, 2/3, 3/4, 5/6], $A_1$ is less than $A_2$, $C=(N/2)\times(1+\beta)$, $\beta=1/4\times(1-(K+Kcrc)/M$, K is a quantity of information bits, and Kcrc is a quantity of check bits. If neither the fourth preset condition nor the fifth preset condition is met, the shortening manner 2 is used. In addition, if the fourth preset condition is that the code rate is less than a first code rate threshold $A_1$, the fifth preset condition may be that the code rate is greater than or equal to a second code rate threshold $A_2$ and the target code length is less than or equal to a first code length threshold C.

In this manner, optionally, the fourth preset condition is that the code rate is less than or equal to 1/4 or 1/3, and the fifth preset condition is that the code rate is greater than or equal to 1/2 and the target code length is less than the first code length threshold C, there $C=(N/2)\times(1+\beta)$, and $\beta=1/4\times(1-(K+Kcrc)/M$. If the fourth preset condition is met, the puncturing manner 2 or the puncturing manner 4 is used. If the fifth preset condition is met, the shortening manner 1, the shortening manner 3, or the shortening manner 4 is used. If neither the fourth preset condition nor the fifth preset condition is met, the shortening manner 2 is used.

In this implementation, the communications device may compare the code rate and the code rate threshold and compare the target code length and the target code length threshold. In this way, the puncturing or shortening manner is flexibly selected, for example, puncturing is used for a low code rate and shortening is used for a high code rate or a medium code rate, so that performance is relatively good under different encoding parameters, and a performance loss is avoided in a puncturing or shortening process.

In this implementation, a code length is further considered, and therefore, it can be ensured that performance is not apparently poor, but is more stable than that in the implementation 1.

III. The communications device determines the to-be-used rate matching manner based on the code rate and two code rate thresholds. In this manner, there is specifically one optional case.

If the code rate is less than or equal to a third code rate threshold $A_3$, any one of the puncturing manner 1, the puncturing manner 2, the puncturing manner 3, and the puncturing manner 4 is used, where $A_3$ is any value in a set [1/12, 1/6, 1/5, 1/4, 1/3, 2/5]. If the code rate is greater than $A_3$ and less than or equal to a fourth code rate threshold $A_4$, the shortening manner 2 is used, where $A_4$ is any value in a set [1/2, 2/3, 3/4, 5/6]. If the code rate is greater than or equal to $A_4$, the shortening manner 3 or the shortening manner 4 is used.

In this manner, optionally, $A_3$ is 1/4, and $A_4$ is 1/2. If the code rate is less than or equal to 1/4, the puncturing manner 2 or the puncturing manner 4 is used; if the code rate is greater than 1/4 and less than 1/2, the shortening manner 2 is used; or if the code rate is greater than or equal to 1/2, the shortening manner 3 or the shortening manner 4 is used.

In this implementation, the communications device may compare the code rate and the two preset code rate thresholds. In this way, the puncturing or shortening manner is flexibly selected, for example, puncturing is used for a low code rate and shortening is used for a high code rate or a medium code rate, so that performance is relatively good under different encoding parameters, and a performance loss is avoided in a puncturing or shortening process.

IV. The communications device determines the to-be-used rate matching manner based on the code rate and one code rate threshold. In this manner, there is specifically one optional case.

If the code rate is less than or equal to a first code rate threshold $A_1$, any one of the puncturing manner 1, the puncturing manner 2, the puncturing manner 3, and the puncturing manner 4 is used; or if the code rate is greater than the first code rate threshold $A_1$, the shortening manner 2, the shortening manner 3, or the shortening manner 4 is used, where $A_1$ may be any value in a set [1/12, 1/6, 1/5, 1/4, 1/3, 2/5].

In this implementation, the communications device may compare the code rate and the one preset code rate threshold. In this way, the puncturing or shortening manner is flexibly selected, for example, puncturing is used for a low code rate and shortening is used for a high code rate or a medium code rate, so that performance is relatively good under different encoding parameters, and a performance loss is avoided in a puncturing or shortening process.

According to the polar code rate matching method provided in this embodiment, after determining the code rate, the communications device determines the to-be-used rate matching manner by comparing the code rate and the code rate threshold and comparing the quantity of information bits and the information bit threshold, or determines the to-be-used rate matching manner by comparing the code rate and the code rate threshold and comparing the target code length and the target code length threshold, or determines the to-be-used rate matching manner by comparing the code rate and the two preset code rate thresholds. In this way, the puncturing or shortening manner can be flexibly selected, for example, puncturing is used for a low code rate and shortening is used for a high code rate or a medium code rate, so that performance is relatively good under different encoding parameters, and a performance loss is avoided in a puncturing or shortening process.

Figure 4:
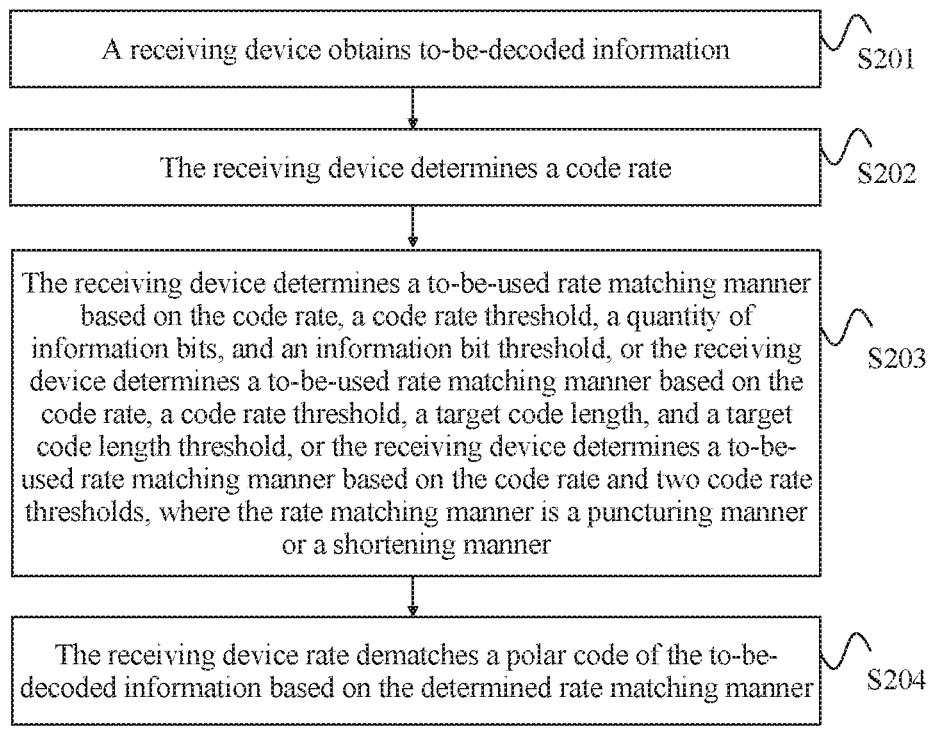
FIG. 4 is a flowchart of a polar code rate dematching method embodiment according to this application.

For a receiving device, the receiving device demodulates received to-be-decoded information to obtain an LLR sequence, and the receiving device rate dematches and decodes the LLR sequence. A process of the rate dematching and decoding operations is specifically as follows: The receiving device obtains a code rate R and an encoding parameter threshold of to-be-decoded information. The encoding parameter threshold includes a code rate threshold, an information bit threshold, or a target code length threshold. The receiving device determines a to-be-used rate matching manner based on the code rate, the code rate threshold, a quantity of information bits, and the information bit threshold, or determines a to-be-used rate matching manner based on the code rate, the code rate threshold, a target code length, and the target code length threshold, or determines a to-be-used rate matching manner based on the code rate and two code rate thresholds. In this way, whether a sending device uses puncturing or shortening as the rate matching manner is ultimately determined. FIG. 4 is a flowchart of a polar code rate dematching method embodiment according to this application. As shown in FIG. 4, a method in this embodiment may include the following steps.

S201. A receiving device obtains to-be-decoded information.

S202. The receiving device determines a code rate.

R=K/M, K is a quantity of information bits, or K is a sum of a quantity of information bits and a quantity of check bits, M is a target code length, and K and M are positive integers.

S203. The receiving device determines a to-be-used rate matching manner based on the code rate, a code rate threshold, the quantity of information bits, and an information bit threshold, or the receiving device determines a to-be-used rate matching manner based on the code rate, a code rate threshold, the target code length, and a target code length threshold, or the receiving device determines a to-be-used rate matching manner based on the code rate and two code rate thresholds, where the rate matching manner is a puncturing manner or a shortening manner.

S204. The receiving device rate dematches a polar code of the to-be-decoded information based on the determined rate matching manner.

Details about a specific process of determining the selected rate matching manner in S203 are similar to description in the embodiment shown in FIG. 3. Details are not described herein again.

If a sending device uses the shortening manner, during decoding, an LLR corresponding to a shortened bit location is set to a relatively large value (a specific symbol corresponds to a symbol used in actual encoding) for decoding; or if a sending device uses the puncturing manner for rate matching, during decoding, an LLR at punctured bit locations is set to 0 for decoding. With the foregoing operations, the receiving device can successfully complete a rate dematching process and a decoding process.

In this application, the sending device and the receiving device may be divided into function modules based on the foregoing method examples. For example, the function modules may be obtained through division based on corresponding functions, or two or more functions may be integrated into one processing module. The integrated module may be implemented in a form of hardware, or may be implemented in a form of a software function module. It should be noted that, in embodiments of this application, division into modules is an example and is merely logical function division. In actual implementation, another division manner may be used.

Figure 5:
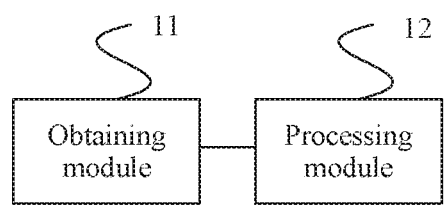
FIG. 5 is a schematic structural diagram of a polar code rate matching apparatus embodiment according to this application.

FIG. 5 is a schematic structural diagram of a polar code rate matching apparatus embodiment according to this application. As shown in FIG. 5, the apparatus in this embodiment may include an obtaining module 11 and a processing module 12. The obtaining module 11 is configured to obtain to-be-encoded information or to-be-decoded information. The processing module 12 is configured to: determine a code rate R, where R=K/M, K is a quantity of information bits, or K is a sum of a quantity of information bits and a quantity of check bits, M is a target code length, and K and M are positive integers; determine a to-be-used rate matching manner based on the code rate, a code rate threshold, the quantity of information bits, and an information bit threshold, or determine a to-be-used rate matching manner based on the code rate, a code rate threshold, the target code length, and a target code length threshold, or determine a to-be-used rate matching manner based on the code rate and two code rate thresholds, where the rate matching manner is a puncturing manner or a shortening manner; and based on the determined rate matching manner, rate match a polar code of the to-be-encoded information, or rate dematch a polar code of the to-be-decoded information.

If the communications device is a sending device, the obtaining module 11 is configured to obtain to-be-encoded information; and the processing module 12 is configured to rate match a polar code of the to-be-encoded information based on the determined rate matching manner. If the communications device is a receiving device, the obtaining module 11 is configured to obtain to-be-decoded information; and the processing module 12 is configured to rate dematch a polar code of the to-be-decoded information based on the determined rate matching manner.

For details about the puncturing manner and the shortening manner, refer to specific description in the embodiment shown in FIG. 3. Details are not described herein again.

Optionally, the processing module 12 is configured to: if a first preset condition is met, use any one of a puncturing manner 1, a puncturing manner 2, a puncturing manner 3, and a puncturing manner 4;

if a second preset condition is met, use a shortening manner 1, a shortening manner 3, or a shortening manner 4; or if neither the first preset condition nor the second preset condition is met, use a shortening manner 2.

For the first preset condition and the second preset condition, refer to specific description in the embodiment shown in FIG. 3. Details are not described herein again.

Further, the first preset condition is that the code rate is less than a code rate threshold 1/5 and the quantity of information bits is less than or equal to an information bit threshold 100, or the code rate is less than a code rate threshold 1/4 and the quantity of information bits is less than or equal to an information bit threshold 30, and the second preset condition is that the code rate is greater than a code rate threshold 3/4; or the first preset condition is that the code rate is less than a code rate threshold 1/4 and the quantity of information bits is less than or equal to an information bit threshold 200, and the second preset condition is that the code rate is greater than a code rate threshold 3/4.

The determining module 12 is specifically configured to: if the first preset condition is met, use the puncturing manner 2 or the puncturing manner 4; if the second preset condition is met, use the shortening manner 1 or the shortening manner 3; or if neither the first preset condition nor the second preset condition is met, use the shortening manner 2.

Optionally, the determining module 12 is configured to:

if a third preset condition is met, use any one of a puncturing manner 1, a puncturing manner 2, a puncturing manner 3, and a puncturing manner 4; or if a third preset condition is not met, use a shortening manner 2, a shortening manner 3, or a shortening manner 4. For the third preset condition, refer to specific description in the embodiment shown in FIG. 3. Details are not described herein again.

Further, the third preset condition is that the code rate is less than or equal to 1/5 and the quantity of information bits is less than or equal to 100, or the third preset condition is that the code rate is less than or equal to 1/4 and the quantity of information bits is less than or equal to 30, or the third preset condition is that the code rate is less than or equal to 1/4 and the quantity of information bits is less than or equal to 200. The determining module 12 is specifically configured to: if the third preset condition is met, use the puncturing manner 2 or the puncturing manner 4; or if the third preset condition is not met, use the shortening manner 2, the shortening manner 3, or the shortening manner 4.

Optionally, the determining module 12 is configured to: if a fourth preset condition is met, use any one of a puncturing manner 1, a puncturing manner 2, a puncturing manner 3, and a puncturing manner 4; or if a fifth preset condition is met, use a shortening manner 1, a shortening manner 3, or a shortening manner 4; or if neither the fourth preset condition nor the fifth preset condition is met, use a shortening manner 2. For the fourth preset condition and the fifth preset condition, refer to specific description in the embodiment shown in FIG. 3. Details are not described herein again.

Further, the fourth preset condition is that the code rate is less than or equal to 1/4 or 1/3, and the fifth preset condition is that the code rate is greater than 1/2 and the target code length is less than a first code length threshold C.

The determining module is specifically configured to: if the fourth preset condition is met, use the puncturing manner 2 or the puncturing manner 4; if the fifth preset condition is met, use the shortening manner 1, the shortening manner 3, or the shortening manner 4; or if neither the fourth preset condition nor the fifth preset condition is met, use the shortening manner 2.

Optionally, the determining module 12 is configured to:

if the code rate is less than or equal to a third code rate threshold $A_3$, use any one of a puncturing manner 1, a puncturing manner 2, a puncturing manner 3, and a puncturing manner 4, where $A_3$ is any value in a set [1/12, 1/6, 1/5, 1/4, 1/3, 2/5];

if the code rate is greater than $A_3$ and less than a fourth code rate threshold $A_4$, use a shortening manner 2, where $A_4$ is any value in a set [1/2, 2/3, 3/4, 5/6]; or if the code rate is greater than or equal to $A_4$, use a shortening manner 3 or a shortening manner 4.

Further, $A_3$ is 1/4, $A_4$ is 1/2, and the determining module 12 is specifically configured to: if the code rate is less than or equal to 1/4, use the puncturing manner 2 or the puncturing manner 4; if the code rate is greater than or equal to 1/4 and less than 1/2, use the shortening manner 2; or if the code rate is greater than or equal to 1/2, use the shortening manner 3 or the shortening manner 4.

The apparatus in this embodiment may be configured to perform the technical solutions of the method embodiment shown in FIG. 3. An implementation principle and a technical effect of the apparatus are similar to those of the technical solutions of the method embodiment shown in FIG. 3. Details are not described herein again.

Figure 6:
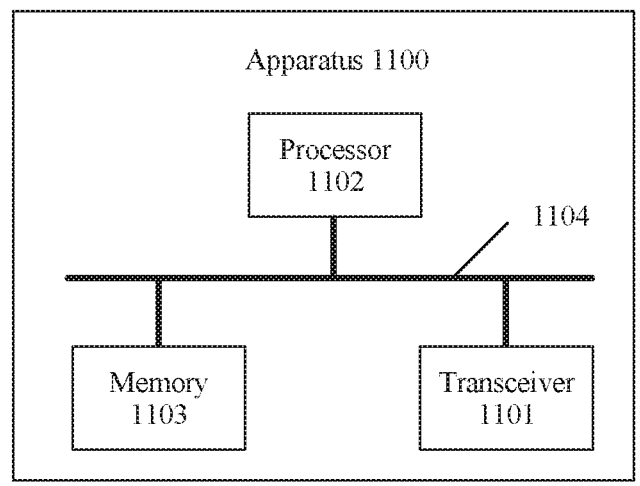
FIG. 6 is a schematic diagram of a polar code rate matching entity apparatus according to this application.

FIG. 6 is a schematic diagram of a polar code rate matching entity apparatus according to this application. The apparatus 1100 includes: a transceiver 1101, a memory 1103, and a processor 1102.

The transceiver 1101 is configured to obtain to-be-encoded information or to-be-decoded information.

The memory 1103 is configured to store a program instruction. The memory may be a flash (flash memory).

The processor 1102 is configured to invoke and execute the program instruction in the memory, to perform steps in the polar code rate matching method shown in FIG. 3. For details, refer to related description in the foregoing method embodiment.

Optionally, the memory 1103 may be independent or may be integrated with the processor 1102.

When the memory 1103 is a device independent of the processor 1102, the apparatus 1100 may further include:

a bus 1104, configured to connect the memory 1103 and the processor 1102.

The apparatus may be configured to perform steps and/or procedures corresponding to the communications device in the foregoing method embodiments.

This application further provides a readable storage medium. The readable storage medium stores an execution instruction. When at least one processor of a polar code rate matching apparatus executes the execution instruction, the polar code rate matching apparatus performs the rate matching method according to the foregoing implementations.

This application further provides a program product. The program product includes an execution instruction, and the execution instruction is stored in a readable storage medium. At least one processor of a polar code rate matching apparatus may read the execution instruction from the readable storage medium, and the at least one processor executes the execution instruction, so that the polar code rate matching apparatus performs the polar code rate matching method according to the foregoing implementations.

A person of ordinary skill in the art may understand that all or some steps of the method embodiments may be implemented by program instructing related hardware. The foregoing program may be stored in a computer-readable storage medium. When the program is executed, the steps of the method embodiments are performed. The foregoing storage medium includes any medium that can store program code, such as a ROM, a RAM, a magnetic disk, or an optical disc.

The invention claimed is:

1. A rate matching method, comprising:
obtaining to-be-encoded information bits, wherein a quantity of to-be-encoded information bits is K and the K is positive integer;
polar encoding the to-be-encoded information bits to obtain encoded bits;
rate matching the encoded bits to obtain rate matched bits according to a rate matching manner determined based on a code rate R, a code rate threshold, a target code length, and a target code length threshold, wherein the rate matching manner is a puncturing manner or a shortening manner, wherein the R=K/M, wherein the M is the target code length, and the M is positive integer; and
outputting the rate matched bits.

2. The method according to claim 1, further comprising:
if the M is less than a first code rate threshold and the R is less than or equal to the first code rate threshold, determining the rate matching manner to be the puncturing manner.

3. The method according to claim 1, further comprising:
if the M is less than a first code rate threshold and the R is larger than a second code rate threshold, determining the rate matching manner to be the shortening manner.

4. The method according to claim 3, wherein the first code rate threshold and the second code rate threshold are the same.

5. The method according to claim 2, wherein rate matching the encoded bits comprises:
if the rate matching manner is the puncturing manner, puncturing the encoded bits from beginning of the encoded bits based on a quantity of to-be-punctured bits and at least one position of the to-be-punctured bits.

6. The method according to claim 3, wherein rate matching the encoded bits comprises:
if the rate matching manner is the shortening manner, shortening the encoded bits from an end of the encoded bits based on a quantity of to-be-shortened bits and at least one position of the to-be-shortened bits.

7. A rate matching apparatus, comprising:
at least one processor; and
a non-transitory computer-readable storage medium coupled to the at least one processor and storing programming instructions for execution by the at least one processor, wherein the programming instructions instruct the at least one processor to:
obtain to-be-encoded information bits, wherein a quantity of to-be-encoded information bits is K and the K is positive integer;
polar encode the to-be-encoded information bits to obtain encoded bits;
rate match the encoded bits to obtain rate matched bits according to a rate matching manner determined based on a code rate R, a code rate threshold, a target code length, and a target code length threshold, wherein the rate matching manner is a puncturing manner or a shortening manner, wherein the R=K/M, wherein the M is a target code length, and the M is positive integer; and
output the rate matched bits.

8. The apparatus according to claim 7, wherein the programming instructions instruct the at least one processor to determine the rate matching manner to be the puncturing manner if the M is less than a first code rate threshold and the R is less than or equal to the first code rate threshold.

9. The apparatus according to claim 7, wherein the programming instructions instruct the at least one processor to determine the rate matching manner to be the shortening manner if the M is less than a first code rate threshold and R is larger than a second code rate threshold.

10. The apparatus according to claim 9, wherein the first code rate threshold and the second code rate threshold are the same.

11. The apparatus according to claim 8, wherein the programming instructions instruct the at least one processor to puncture the encoded bits from beginning of the encoded bits based on a quantity of to-be-punctured bits and at least one position of the to-be-punctured bits if the rate matching manner is puncturing manner.

12. The apparatus according to claim 9, wherein the programming instructions instruct the at least one processor to shorten the encoded bits from an end of the encoded bits based on a quantity of to-be-shortened bits and at least one position of the to-be-shortened bits if the rate matching manner is shortening manner.

13. A non-transitory, computer-readable storage medium storing one or more instructions executable by an apparatus to perform operations comprising:
obtaining to-be-encoded information bits, wherein a quantity of to-be-encoded information bits is K and the K is positive integer;
polar encoding the to-be-encoded information bits to obtain encoded bits;
rate matching the encoded bits to obtain rate matched bits according to a rate matching manner determined based on a code rate R, a code rate threshold, a target code length, and a target code length threshold wherein the rate matching manner is a puncturing manner or a shortening manner, wherein the R=K/M, wherein the M is the target code length, and the M is positive integer; and
outputting the rate matched bits.

14. The non-transitory, computer-readable storage medium according to claim 13, wherein the operations further comprise determining, the rate matching manner is the puncturing manner if the M is less than a first code rate threshold and R is less than or equal to the first code rate threshold.

15. The non-transitory, computer-readable storage medium according to claim 13, wherein the operations further comprise determining the rate matching manner to be the shortening manner if the M is less than a first code rate threshold and the R is larger than a second code rate threshold.

16. The non-transitory, computer-readable storage medium according to claim 13, wherein the code rate threshold comprises a first code rate threshold and a second code rate threshold, and the first code rate threshold and the second code rate threshold are the same.

17. The non-transitory, computer-readable storage medium according to claim 14, wherein rate matching the encoded bits comprises puncturing the encoded bits from beginning of the encoded bits based on a quantity of to-be-punctured bits and at least one position of the to-be-punctured bits if the rate matching manner is the puncturing manner.

18. The non-transitory, computer-readable storage medium according to claim 15, wherein rate matching the encoded bits comprises shortening the encoded bits from an end of the encoded bits based on a quantity of to-be-shortened bits and at least one position of the to-be-shortened bits if the rate matching manner is the shortening manner.

19. A program product, wherein the program product comprises execution instructions, the execution instructions are stored in a computer-readable storage medium, and the execution instructions cause a rate matching apparatus to perform operations comprising:
obtaining to-be-encoded information bits, wherein a quantity of to-be-encoded information bits is K and the K is positive integer;
polar encoding the to-be-encoded information bits to obtain encoded bits; and
rate matching the encoded bits according to a rate matching manner based on a code rate R, a code rate threshold, a target code length, and a target code length threshold wherein the rate matching manner is a puncturing manner or a shortening manner, wherein the R=K/M, wherein the M is the target code length, and the M is positive integer.

20. The method according to claim 1, wherein rate matching the encoded bits comprises puncturing the encoded bits based on a quantity of to-be-punctured bits and preset puncturing locations.

21. The method according to claim 20, wherein the quantity of to-be-punctured bits is P, and wherein the puncturing the encoded bits from beginning of the encoded bits based on the quantity of to-be-punctured bits and the preset puncturing locations comprises:
   if the P≤N/4, wherein the N is a mother code length of the to-be-encoded information bits, the preset puncturing locations are first P bits, or
   if the P>N/4, the preset puncturing locations are bits 1 to N/4 and a bit j, wherein j is determined according to the following formulas:

$j = N/4, \ldots, N/4 + \lceil ((P-N/4)/2) \rceil - 1;$ $j = N/2, \ldots, N/2 + \lfloor ((P-N/4)/2) \rfloor - 1;$ wherein the symbol $\lceil\ \rceil$ indicates rounding up to the nearest integer, and the symbol $\lfloor\ \rfloor$ indicates rounding down to the nearest integer.

22. The method according to claim 1, wherein rate matching the encoded bits comprises shortening the encoded bits based on a quantity of to-be-shortened bits and preset shortening locations.

23. The apparatus according to claim 7, wherein rate matching the encoded bits comprises puncturing the encoded bits based on a quantity of to-be-punctured bits and preset puncturing locations.

24. The apparatus according to claim 23, wherein the quantity of to-be-punctured bits is P, and wherein the puncturing the encoded bits from beginning of the encoded bits based on the quantity of to-be-punctured bits and the preset puncturing locations comprises:
   if the P≤N/4, wherein the N is a mother code length of the to-be-encoded information bits, the preset puncturing locations are first P bits, or
   if the P>N/4, the preset puncturing locations are bits 1 to N/4 and a bit j, wherein j is determined according to the following formulas:

$j = N/4, \ldots, N/4 + \lceil ((P-N/4)/2) \rceil - 1;$ $j = N/2, \ldots, N/2 + \lfloor ((P-N/4)/2) \rfloor - 1;$ wherein the symbol $\lceil\ \rceil$ indicates rounding up to the nearest integer, and the symbol $\lfloor\ \rfloor$ indicates rounding down to the nearest integer.

25. The apparatus according to claim 7, wherein rate matching the encoded bits comprises shortening the encoded bits based on a quantity of to-be-shortened bits and preset shortening locations.

* * * * *